United States Patent
Drexler et al.

(10) Patent No.: US 7,423,462 B2
(45) Date of Patent: *Sep. 9, 2008

(54) CLOCK CAPTURE IN CLOCK SYNCHRONIZATION CIRCUITRY

(75) Inventors: Adrian J Drexler, Meridian, ID (US); Debra M Bell, Boise, ID (US); Tyler J Gomm, Meridian, ID (US); Seong-hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/489,367

(22) Filed: Jul. 18, 2006

(65) Prior Publication Data

US 2006/0255845 A1 Nov. 16, 2006

Related U.S. Application Data

(62) Division of application No. 10/840,015, filed on May 5, 2004, now Pat. No. 7,095,261.

(51) Int. Cl.
*H03L 7/06* (2006.01)
*H03L 7/00* (2006.01)

(52) U.S. Cl. .................. 327/158; 327/153; 327/161

(58) Field of Classification Search .................. None
See application file for complete search history.

(56) References Cited

U.S. PATENT DOCUMENTS

| | | | |
|---|---|---|---|
| 4,805,021 A | 2/1989 | Harlos et al. | |
| 6,198,690 B1 | 3/2001 | Kato et al. | |
| 6,208,183 B1 | 3/2001 | Li et al. | |
| 6,292,040 B1 | 9/2001 | Iwamoto et al. | |
| 6,373,913 B1 * | 4/2002 | Lee | 375/376 |
| 6,437,613 B2 * | 8/2002 | Shim et al. | 327/141 |
| 6,556,489 B2 | 4/2003 | Gomm et al. | |
| 6,586,979 B2 | 7/2003 | Gomm et al. | |
| 6,727,734 B2 | 4/2004 | Gomm | |
| 6,727,740 B2 | 4/2004 | Kirsch | |
| 6,735,148 B2 | 5/2004 | Gomm | |
| 6,737,897 B2 | 5/2004 | Gomm et al. | |
| 6,759,882 B2 * | 7/2004 | Lin | 327/155 |
| 6,759,883 B2 | 7/2004 | Gomm | |
| 6,774,687 B2 | 8/2004 | Gomm et al. | |
| 6,781,861 B2 | 8/2004 | Gomm et al. | |
| 6,803,826 B2 | 10/2004 | Gomm et al. | |
| 6,850,107 B2 | 2/2005 | Gomm | |
| 6,853,225 B2 | 2/2005 | Lee | |
| 6,924,686 B2 * | 8/2005 | Kirsch | 327/277 |
| 6,982,579 B2 | 1/2006 | Lee | |
| 7,095,261 B2 | 8/2006 | Drexler et al. | |
| 2002/0190766 A1 | 12/2002 | Waldrop | |
| 2003/0081472 A1 | 5/2003 | Lin | |
| 2004/0041606 A1 * | 3/2004 | Kirsch | 327/161 |
| 2004/0044918 A1 | 3/2004 | Dermott et al. | |
| 2004/0057331 A1 | 3/2004 | Graaff | |

(Continued)

*Primary Examiner*—Tuan T. Lam
(74) *Attorney, Agent, or Firm*—Ropes & Gray LLP (57) ABSTRACT

Clock capturing synchronization circuitry first generates a synchronized clock signal from a reference clock signal, then captures the synchronized clock signal, and continues to output a synchronized clock signal after the reference clock signal is removed. The clock capturing synchronization circuitry also reduces input referred jitter in the synchronized clock signal.

20 Claims, 12 Drawing Sheets

U.S. PATENT DOCUMENTS

2005/0062510 A1  3/2005  Zarate et al.
2005/0116751 A1  6/2005  Lin
2005/0122153 A1  6/2005  Lin

* cited by examiner

CLOCK CAPTURE IN CLOCK SYNCHRONIZATION CIRCUITRY

CROSS-REFERENCE TO RELATED APPLICATION

This application is a division of copending, commonly-assigned U.S. patent application Ser. No. 10/840,015, filed May 5, 2004, now U.S. Pat. No. 7,095,261.

BACKGROUND OF THE INVENTION

This invention relates to the "capture" of a synchronized clock signal in clock synchronization circuitry. More particularly, this invention relates to clock synchronization circuitry that temporarily provides a synchronized clock output signal without a reference clock input signal. This invention also relates to clock synchronization circuitry that provides a synchronized clock output signal with little or no jitter caused by the reference clock input signal.

Clock synchronization circuitry is used to generate a synchronized clock signal based on a reference clock signal. The synchronized clock signal is ideally in phase with the reference clock signal. One type of clock synchronization circuit is a delay-locked loop (DLL). A DLL uses a variable delay circuit to add phase delay to the input reference clock signal before it is output from the DLL. The DLL uses a phase detector to measure the phase difference between the output of the DLL and the reference clock and to adjust the variable delay to minimize the phase difference.

Another type of clock synchronization circuit is a synchronous mirror delay (SMD). The SMD uses a matched pair of delay arrays, a forward delay array and a backward delay array, to output a delayed clock signal synchronized to the input reference clock signal. The reference clock signal is input into the forward delay array. After a set number of clock cycles, a mirror control circuit is triggered to transfer the clock signal from the forward delay array to the same delay stage of the backward delay array. The clock signal spends the same amount of time in the backward delay array as it does in the forward delay array before being output by the SMD. The total delay through both delay arrays synchronizes the output clock signal to the reference clock signal.

Yet another type of clock synchronization circuit is a measure-controlled delay (MCD). In an MCD, the input reference clock signal is provided to two delay arrays, a measure delay array and a forward delay array. After a set number of clock cycles, a measure circuit is triggered to (1) measure the progress of the clock signal propagating through the measure delay array and (2) output the clock signal from the forward delay array at the same delay point as measured in the measure delay array.

In high speed memory devices, these types of clock synchronization circuits may be used to control the precise timing of memory access. Each of these circuits requires an input reference signal in order to generate the synchronized clock signal. During a power-down state, turning off as much circuitry as possible reduces power consumption. However, the reference signal, its associated clock distribution circuitry, and the clock synchronization circuitry are not typically turned off during a power-down state. This is so because many clock cycles are needed to output a valid synchronized clock signal after exiting a power-down state, and high speed memory devices require the presence of synchronized clock signals immediately upon exiting the power-down state.

In view of the forgoing, it would be desirable to be able to provide clock synchronization circuitry that continues to output a synchronized clock signal after the input reference clock signal is removed. Thus, for example, during a power-down state, the reference clock signal distribution circuitry may be powered-down.

The output of synchronization circuitry may also be susceptible to the jitter of the input signal. Jitter is short-term random variations in the timing of a periodic signal. In a clocked system, these random variations in the timing of a clock signal may cause timing errors.

In view of the foregoing, it would be desirable to be able to provide clock synchronization circuitry that reduces input referred jitter in the synchronized clock signal.

SUMMARY OF THE INVENTION

It is an object of this invention to provide clock synchronization circuitry that continues to output a synchronized clock signal after the reference clock signal is removed.

It is also an object of this invention to provide clock synchronization circuitry that reduces, if not eliminates, input referred jitter in the synchronized clock output signal.

In accordance with the invention, clock synchronization circuitry is provided with a clock capturing feedback loop. After the clock synchronization circuitry is locked to the input reference clock signal, the clock synchronization circuitry can switch its input from the input reference clock signal to the fed back synchronized clock output signal. The clock synchronization circuitry can then continue to oscillate with the captured synchronized clock output signal independent of the reference clock signal. This allows the clock synchronization circuitry to provide a synchronized clock output while the input reference clock signal distribution circuitry is shut down (e.g., because of a power down).

The invention also provides clock capturing synchronization circuitry with a duty cycle correction circuit (DCC) or a pulse generator to correct or regenerate the oscillating synchronized clock signal and to reduce any signal degradation which may occur in the circuit. This advantageously allows the clock synchronization circuitry to operate for longer periods of time without the input reference clock signal.

The invention also provides clock synchronization circuitry that reduces input referred jitter. When the synchronized clock signal is fed back and processed at the input of the clock synchronization circuitry instead of the reference clock signal, the jitter present in the reference clock signal is no longer propagated through the clock synchronization circuitry to the synchronized clock output.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention provides clock capture in clock synchronization circuitry that can then output a temporary self-sustaining synchronized clock signal. The invention also reduces input referred jitter in the synchronized clock output signal.

Figure 1:
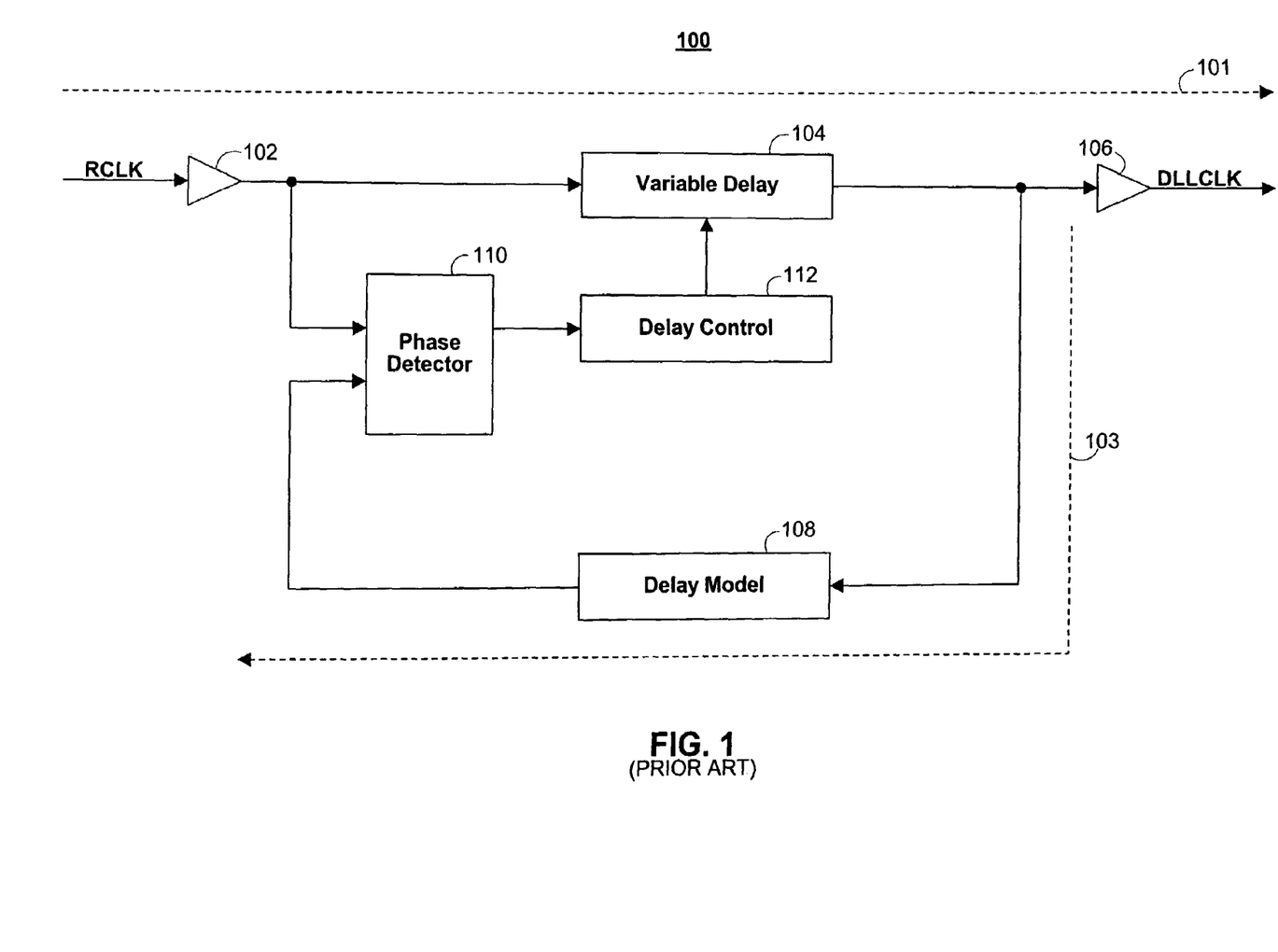
FIG. 1 is a block diagram of a typical delay-locked loop (DLL)

FIG. 1 shows a typical delay-locked loop (DLL) synchronization circuit 100. Reference clock signal RCLK is input to DLL 100, and output signal DLLCLK is a delayed, synchronized version of clock signal RCLK. The phase difference between RCLK and DLLCLK is ideally zero.

DLL 100 typically includes input buffer 102, variable delay 104, output buffer 106, delay model 108, phase detector 110, and delay control 112. Following forward signal path 101, reference clock signal RCLK enters variable delay 104 through input buffer 102. Input buffer 102 delays the input clock signal RCLK by delay D1. Variable delay 104 adds an adjustable amount of delay and outputs the clock signal through output buffer 106 as DLL output signal, DLLCLK. Output buffer 106 delays the clock signal by delay D2. Delay D2 may also include other delays at the output of DLL 100, such as, for example, a clock distribution tree delay or output driver delay.

Variable delay 104 is ideally set to a value that causes DLLCLK to be in phase with RCLK. In order for DLLCLK to be in phase with RCLK, the total delay of forward signal path 101 should be a multiple of the clock period $t_{ck}$ (i.e., the delay is set equal to $N^*t_{ck}$, where N is a whole number greater than or equal to 1). Thus, the delay of variable delay 104 is ideally set to $N^*t_{ck}-(D1+D2)$ (i.e., the total desired delay minus the approximated delay of input and output buffers 102 and 106).

Following feedback signal path 103, the output of variable delay 104 is fed back through delay model 108 to phase detector 110. Delay model 108 "models" the approximate delay of (D1+D2) (i.e., the sum of the approximate delays of input buffer 102 and output buffer 106). The sum of the delays of variable delay 104 and delay model 108 is ideally equal to the delay of forward signal path 101 (i.e., $N^*t_{ck}$).

Phase detector 110 measures the phase difference between reference input clock signal RCLK and synchronized output clock signal DLLCLK. Phase detector 110 controls delay control 112, which adjusts the delay of variable delay 104. Variable delay 104 is adjusted to minimize, if not eliminate, the phase difference measured by phase detector 110 between RCLK and DLLCLK. After variable delay 104 has been adjusted to its optimal setting, the DLL is said to be locked.

Figure 2:
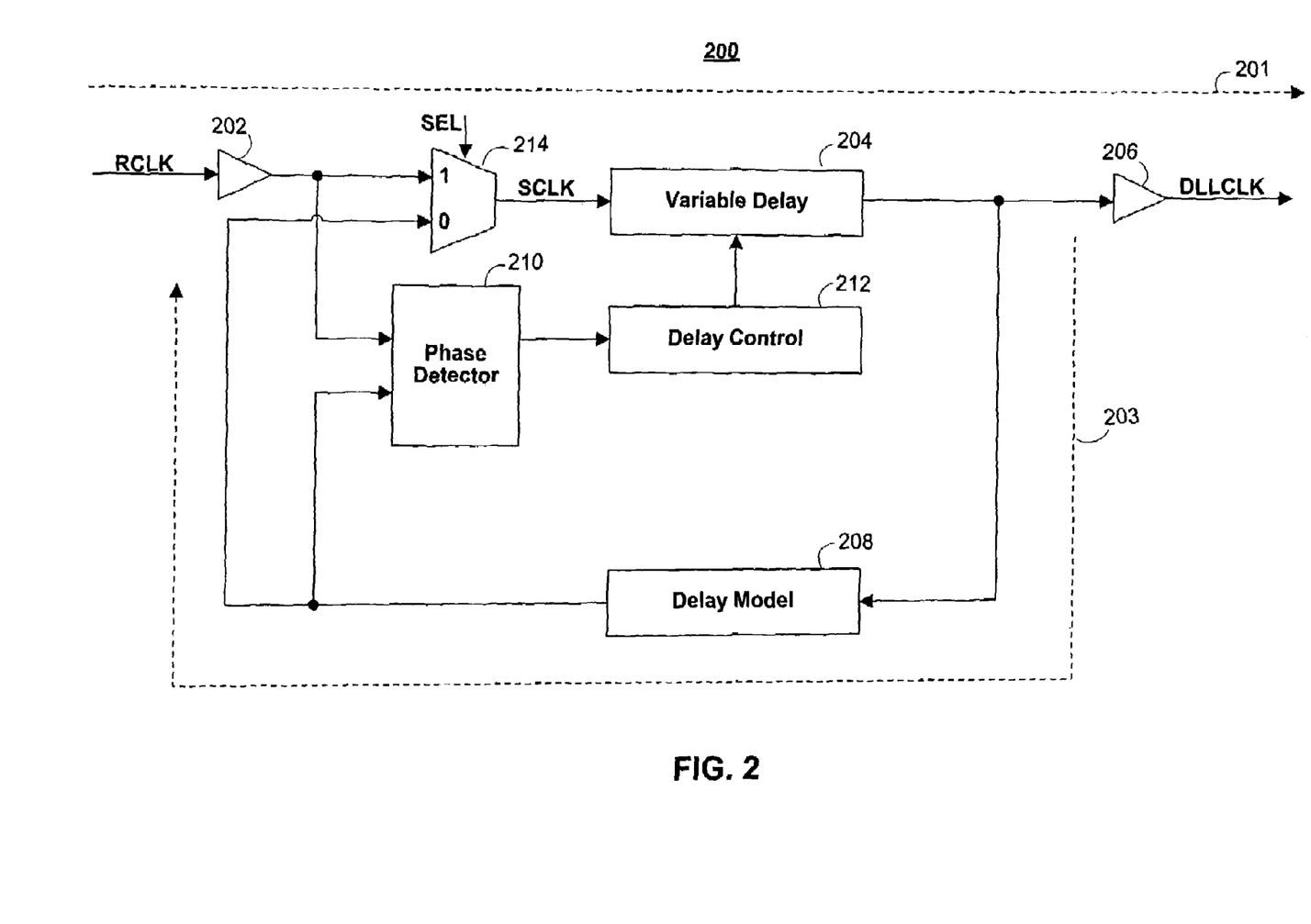
FIG. 2 is a block diagram of a clock capturing DLL according to the invention.

FIG. 2 shows clock capturing DLL 200 in accordance with the invention. As in DLL 100, clock capturing DLL 200 includes input buffer 202, variable delay 204, output buffer 206, delay model 208, phase detector 210, and delay control 212, which all operate similarly or identically to their corresponding counterparts in DLL 100. DLL 200 also preferably includes multiplexer 214. The delay introduced by multiplexer 214 is accounted for by delay model 208.

After variable delay 204 is adjusted and DLL 200 is locked, multiplexer 214 can be switched using control input SEL to pass the feedback signal from path 203 instead of input reference clock RCLK. Thus, feedback signal path 203 can be coupled to forward signal path 201, forming a signal loop. DLL 200 will ideally continue to oscillate with the same phase and period in this "clock captured configuration." Depending on the particular mode of operation of DLL 200, phase detector 210 may be disabled when the clock is captured or it may continue to measure phase difference and adjust variable delay 204, if necessary. Phase detector 210 may also be adjusted just prior to switching into the clock captured configuration to compensate for a phase error which may occur after the clock is captured.

Figure 3:
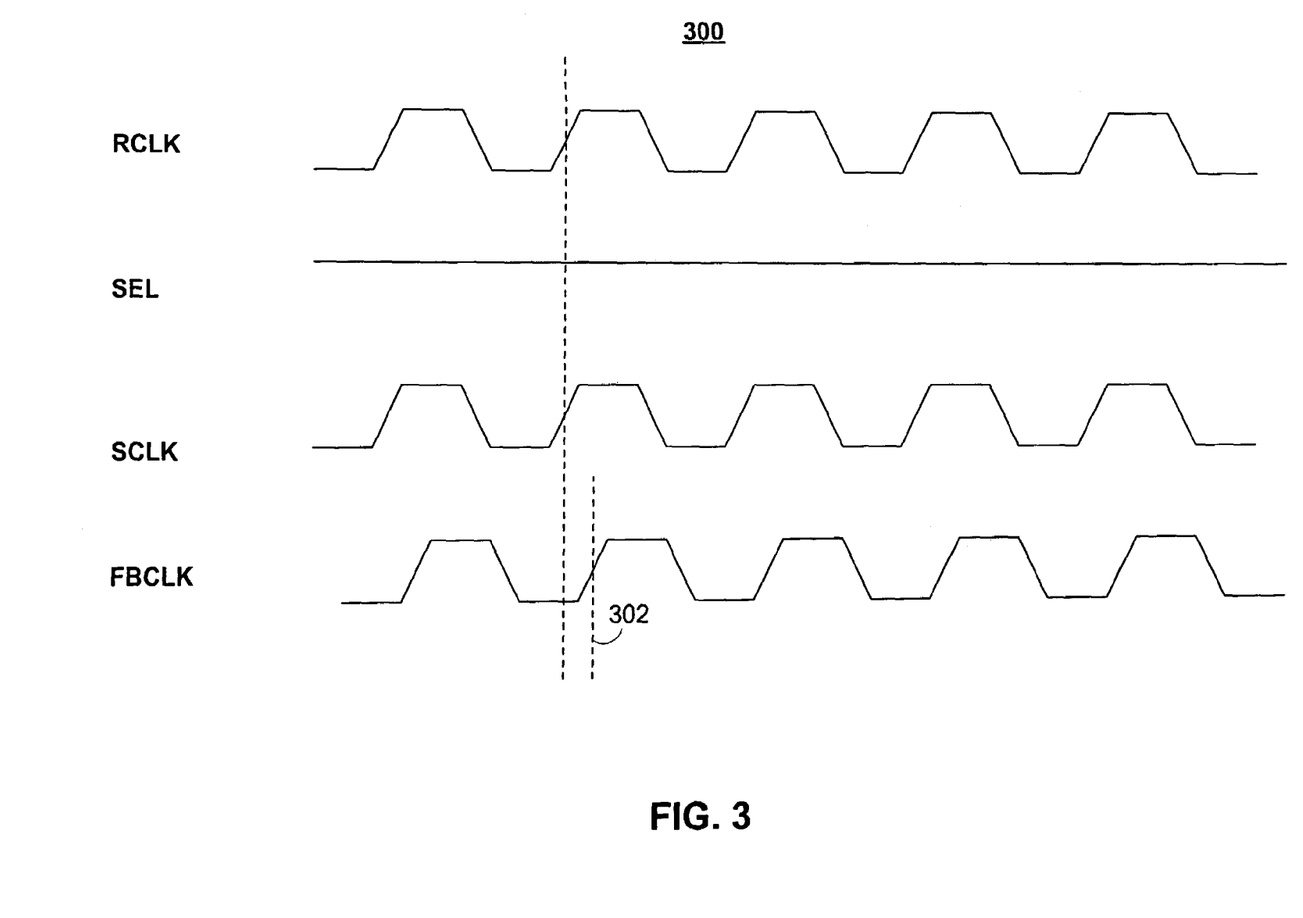
FIG. 3 is a timing diagram of input and output signals of an unlocked clock in a clock capturing DLL according to the invention.
Figure 4:
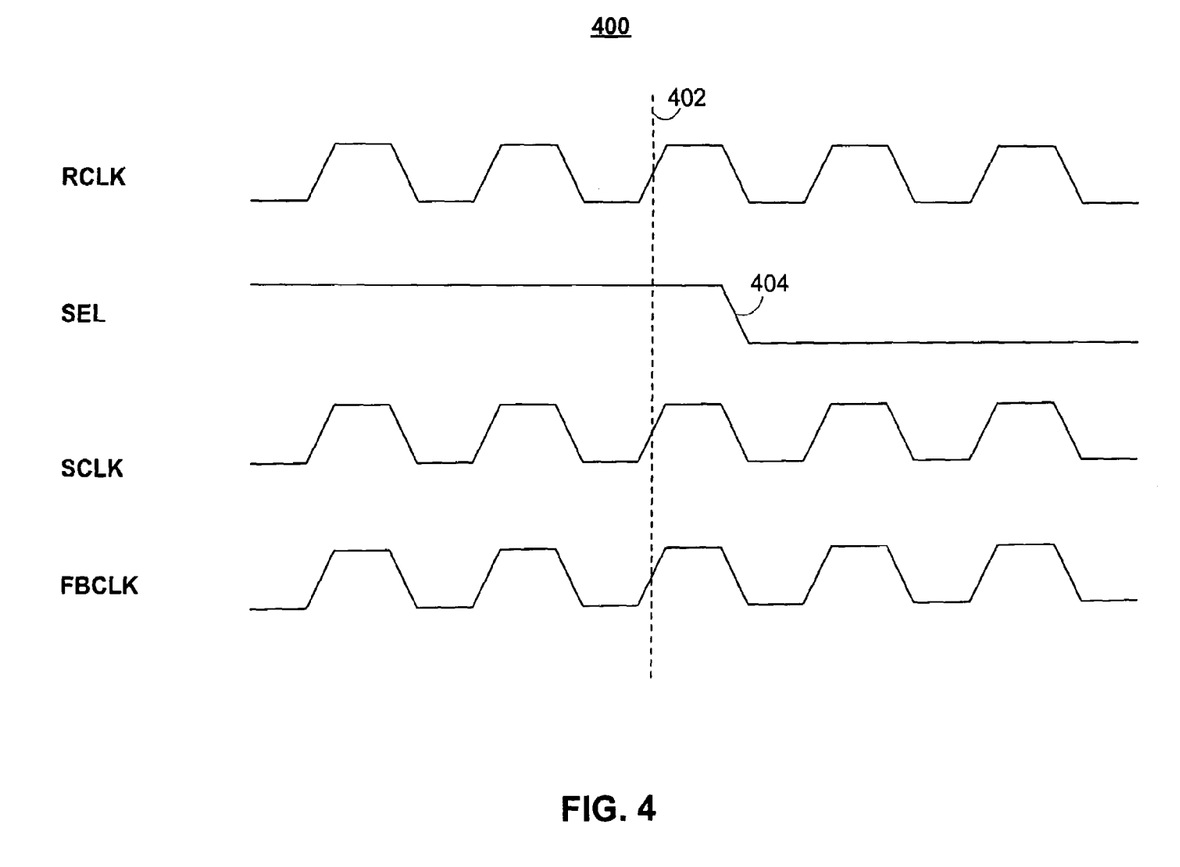
FIG. 4 is a timing diagram of input and output signals of a locked clock in a clock capturing DLL according to the invention.

The operation of DLL 200 is illustrated in FIGS. 3 and 4, which show signal timings before and after the clock is captured, respectively. To simplify the illustrations, the delays of input buffer 202 (D1), output buffer 106 (D2), and delay model 108 (D1+D2) are assumed to be zero. SCLK is the clock signal passed through multiplexer 214.

Referring to FIG. 3, SEL is set to pass RCLK through multiplexer 214 to variable delay 204. The phase difference between the output of multiplexer 214, SCLK, and FBCLK at 302 shows that the DLL is not yet locked.

Referring to FIG. 4, SEL is set at 402 to pass RCLK through multiplexer 214 to variable delay 204. At 404, SCLK and FBCLK are shown in-phase (i.e., no phase difference), so SEL can be switched to pass the feedback signal through multiplexer 214 to variable delay 204. The clock is now captured and DLL 200 will continue to oscillate and maintain its locked state.

After the clock is captured in the clock synchronization circuitry, the reference clock signal can be removed (and/or its associated distribution circuitry disabled) without affecting the oscillation of the circuit. This may be desirable, for example, in double data rate (DDR) synchronous dynamic random access memory (SDRAM). Normally, during an active power-down, the reference clock and the clock synchronization circuitry are not turned off, because they provide the necessary clocking to allow a read operation one clock cycle after exiting the power-down state. If the clock synchronization circuitry were turned off, it would take many clock cycles for it to be turned back on and to output a properly synchronized clock signal. However, according to the invention, the clock synchronization circuitry can capture the clock signal before entering a power-down state. Then, the reference clock distribution circuitry can be shut down, removing the reference clock. The synchronization circuitry continues to oscillate temporarily with the proper period and phase. Thus, the clock synchronization circuitry remains on and ready for the system to exit the power down state, but power is saved by shutting down the reference clock distribution circuitry. This embodiment of the invention has the advantage of reducing power consumption during an active power-down, while producing the necessary clock signal edges to allow the memory to be read when the active power-down state is exited.

Figure 7:
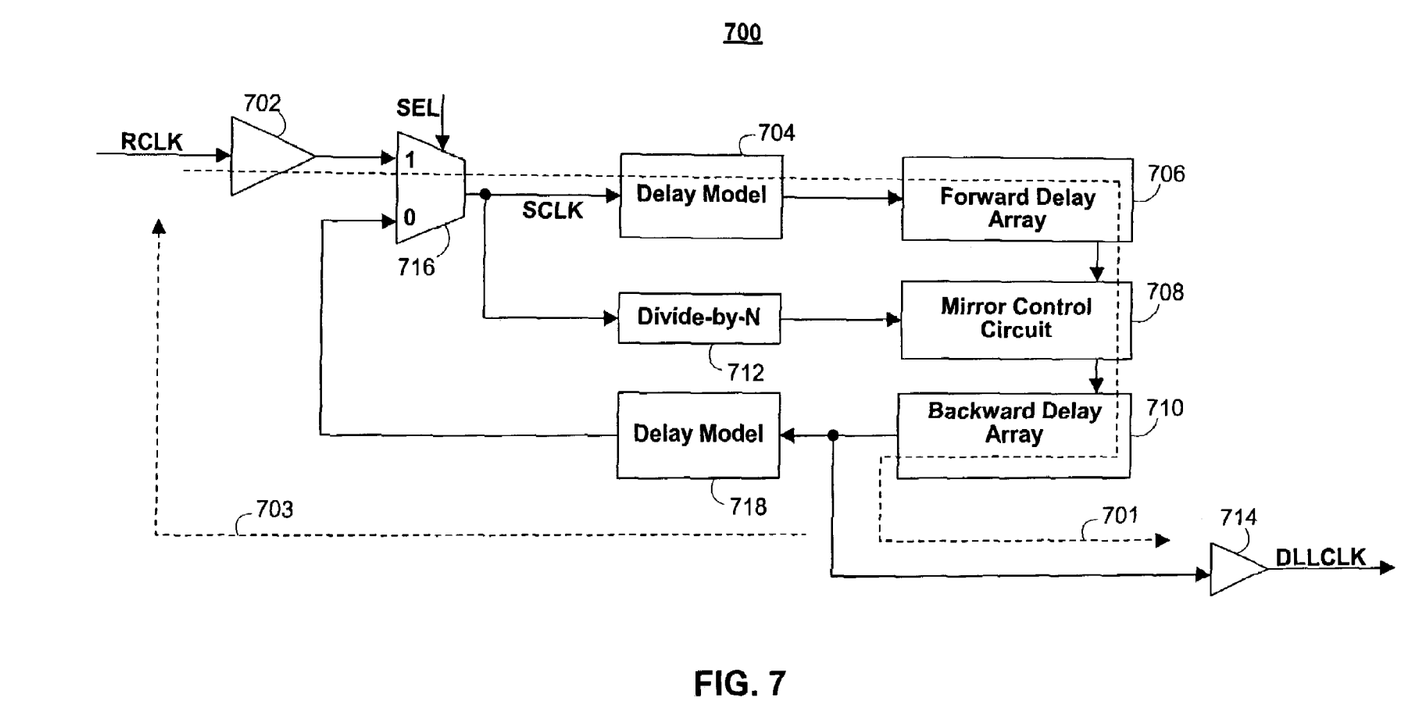
FIG. 7 is a block diagram of a clock capturing SMD according to the invention.
Figure 7A:
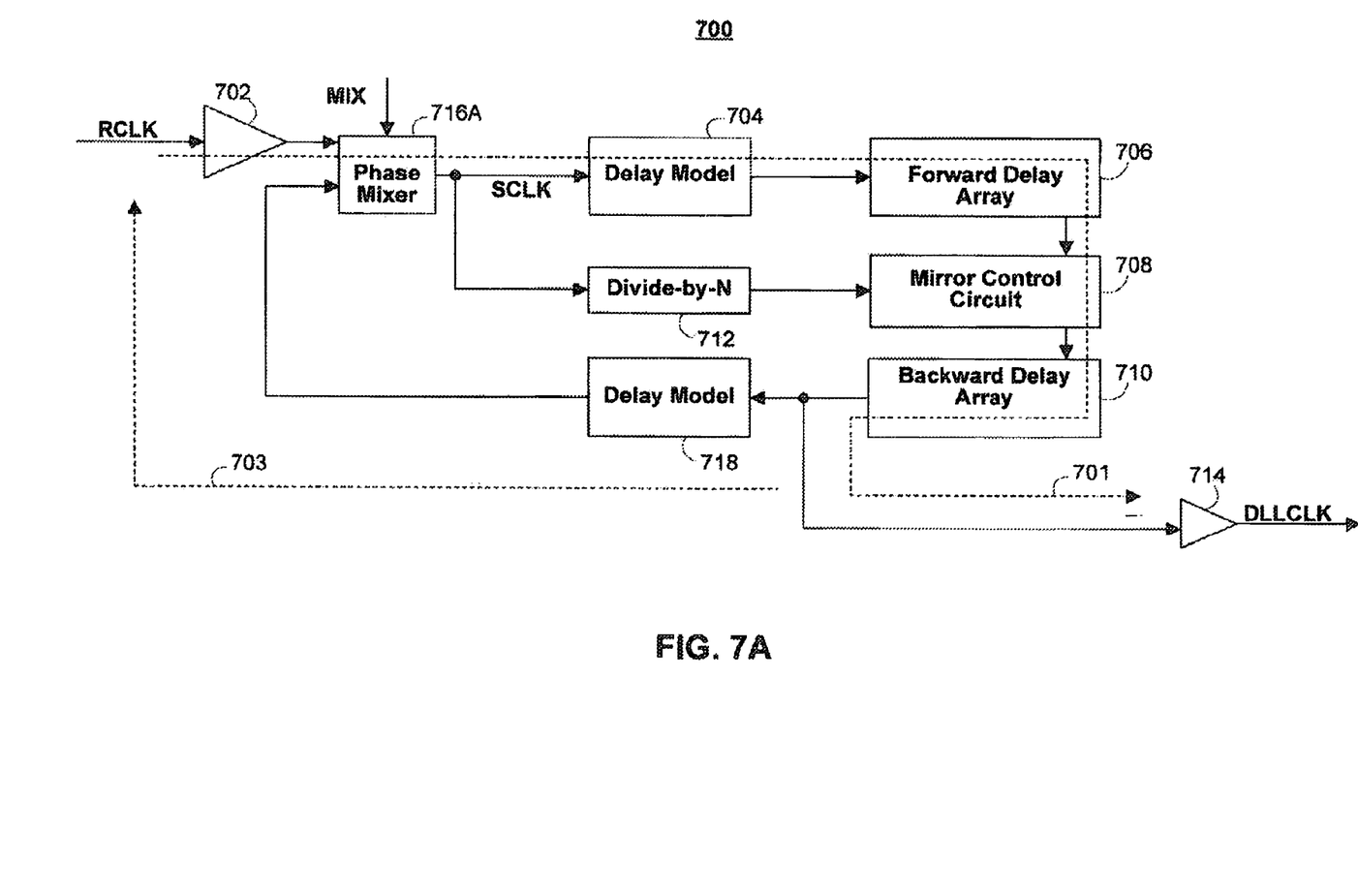
FIG. 7A is a block diagram of a clock capturing SMD including a phase mixing circuit according to the invention.

When the system is ready to exit the power down state, SEL can be switched back to pass the reference clock signal through multiplexer 214 to variable delay 204. The reference clock once again oscillates through DLL 200 instead of the captured clock signal. Throughout the transitions from the clock captured state and back, there is usually little, if any disturbance to the output clock signal. However, after the input reference clock signal is captured and DLL 200 oscillates with the synchronized clock signal for a longer period of time, the system may drift out of synchronization. When this occurs, there may be a phase difference between the oscillating clock signal and the reference clock signal. In this situation, switching back to the reference clock input may cause a disturbance or interruption in the output clock signal. Thus, according to another embodiment of the present invention, multiplexer 214 may be replaced with phase mixing circuitry. Phase mixing circuitry may be able to transition more smoothly between the fed-back clock signal and the reference clock signal and may avoid sudden discontinuity. FIG. 7A shows an illustrative block diagram of a clock capturing SMD in which phase mixing circuit 716a is used instead of a multiplexer in accordance with one embodiment of the invention.

Furthermore, capturing the clock signal in the clock synchronization circuitry reduces jitter in the synchronized clock output signal caused by the jitter in the reference signal. After DLL 200 is locked and the clock is captured, reference clock signal RCLK is no longer used to generate DLL output DLLCLK. Therefore, any jitter in reference clock signal RCLK will no longer propagate through the synchronization circuit and affect output signal DLLCLK. However, if RCLK is still available, it can be used by phase detector 204 to maintain the phase synchronization of DLLCLK even though it is no longer used to generate DLLCLK.

After the input reference clock signal is captured, DLL 200 continues to oscillate with the synchronized clock signal for a period of time. Eventually, as mentioned above, the system may drift out of synchronization. In particular, if the reference clock is removed and no reference signal is available for phase detector 210 to measure, the system may drift out of synchronization sooner than if the reference clock signal were still available to maintain synchronization. Also, the duty cycle of the captured clock signal may become distorted while the captured clock signal oscillates in DLL 200.

Figure 5:
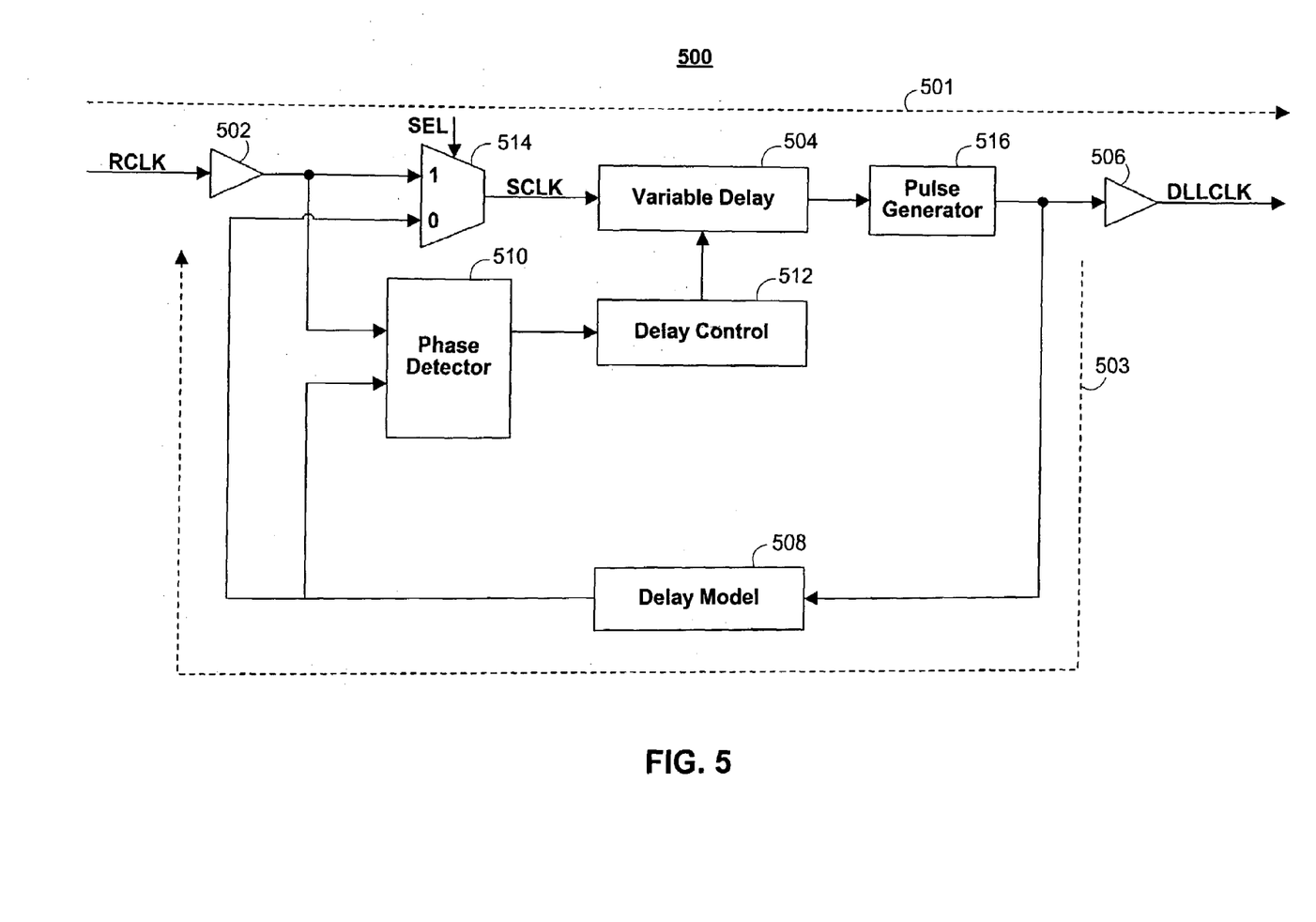
FIG. 5 is a block diagram of a clock capturing DLL including a pulse generator according to the invention.

FIG. 5 shows another embodiment of a clock capturing DLL in accordance with the invention. As in clock capturing DLL 200, clock capturing DLL 500 includes input buffer 502, variable delay 504, output buffer 506, delay model 508, phase detector 510, delay control 512, and multiplexer 514, which all operate similarly or identically to their corresponding counterparts in DLL 200. DLL 500 also preferably includes pulse generator 516.

Pulse generator 516, connected to the output of variable delay 504, generates a pulse with a predetermined width synchronized to the oscillating clock signal. This pulse maintains the duty cycle and general integrity of the oscillating clock signal and prevents the oscillating clock signal from degrading. Thus, the synchronized output clock signal can be provided for a longer period of time.

According to another embodiment of the invention, pulse generator 516 may be replaced by a duty cycle correction circuit (DCC). The DCC corrects the duty cycle distortion of the oscillating clock signal and also prevents the clock signal from degrading.

Figure 6:
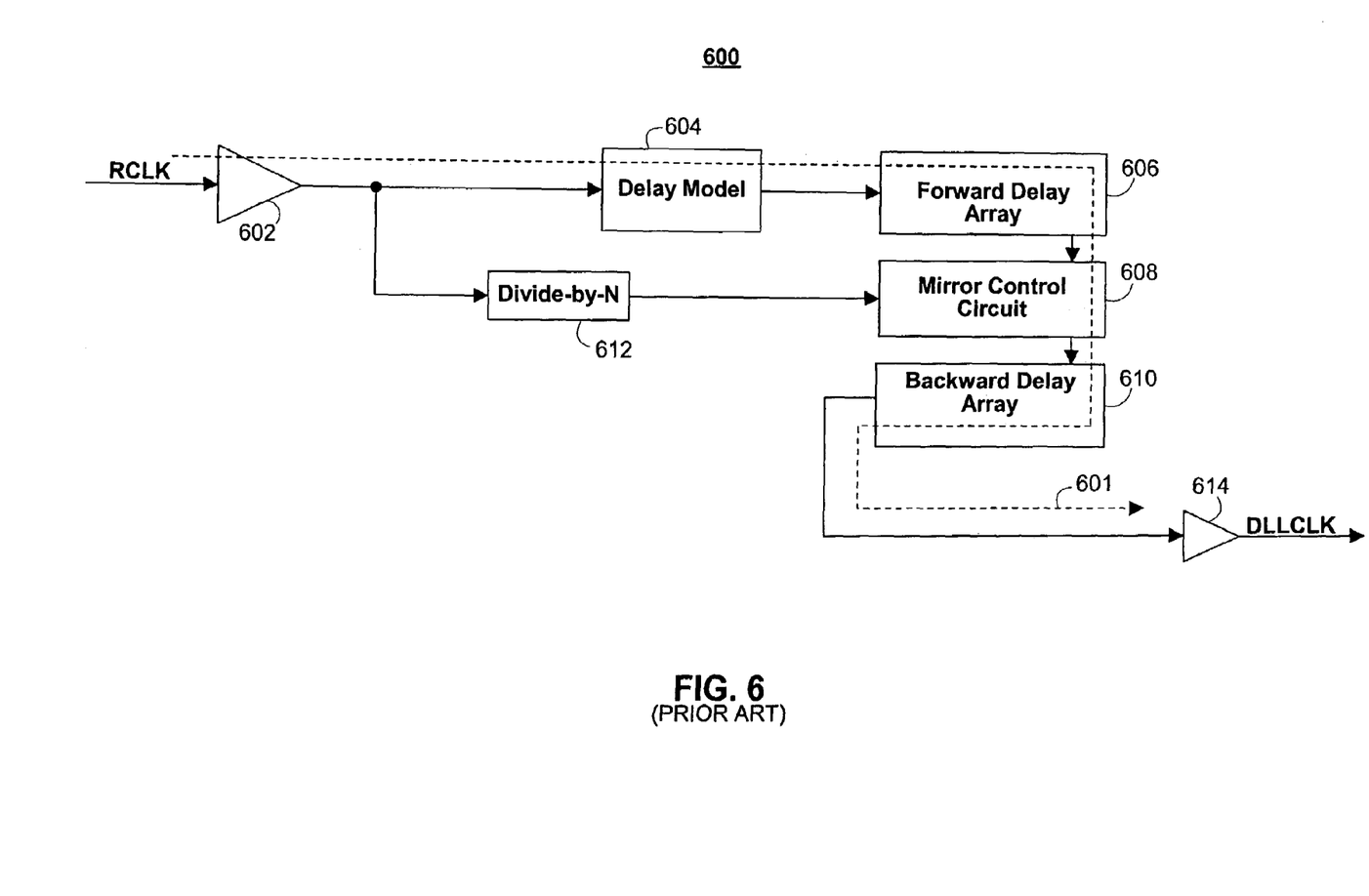
FIG. 6 is a block diagram of a typical Synchronous Mirror Delay (SMD)
Figure 7B:
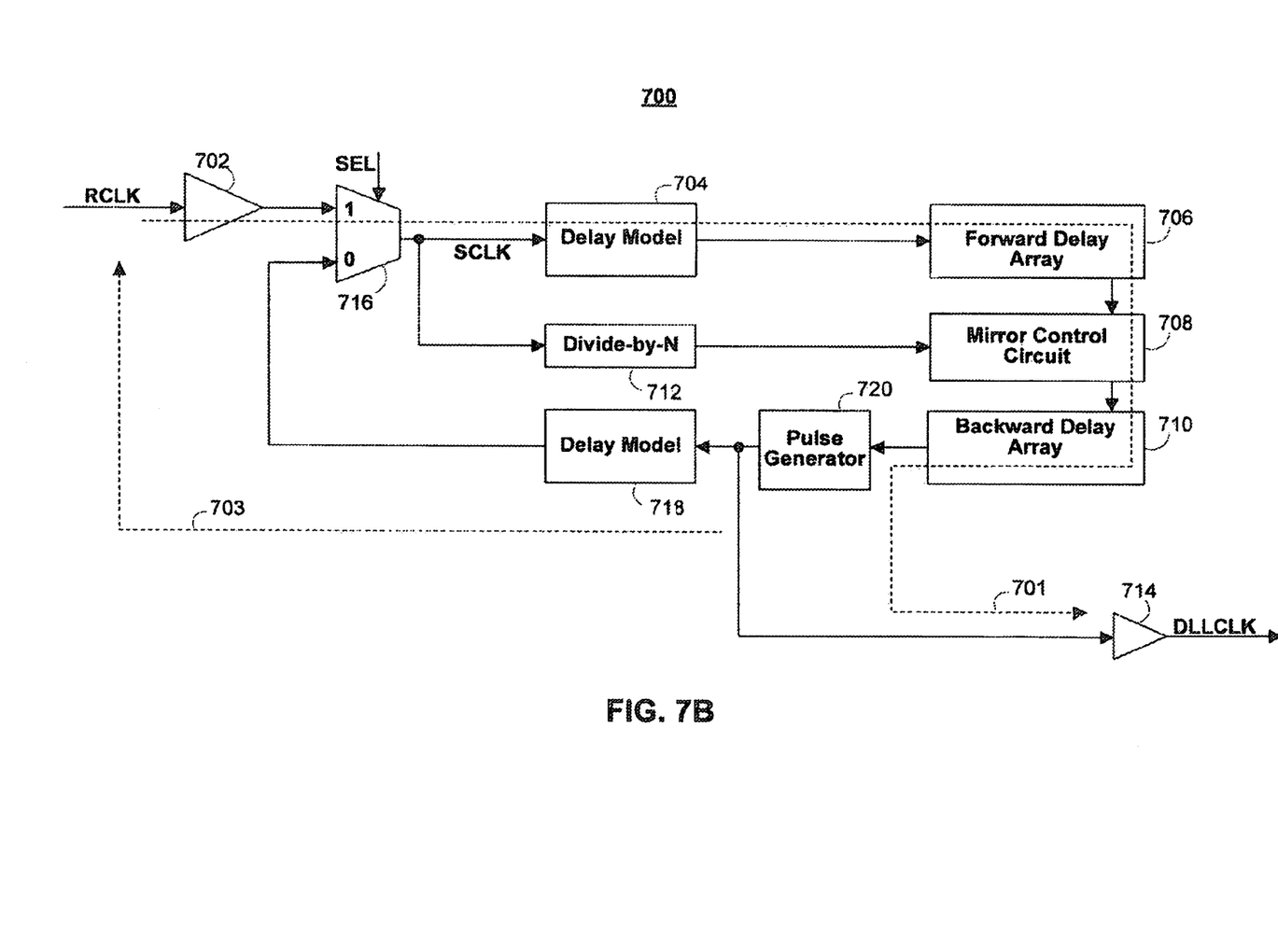
FIG. 7B is a block diagram of a clock capturing SMD including a pulse generator according to the invention.
Figure 8:
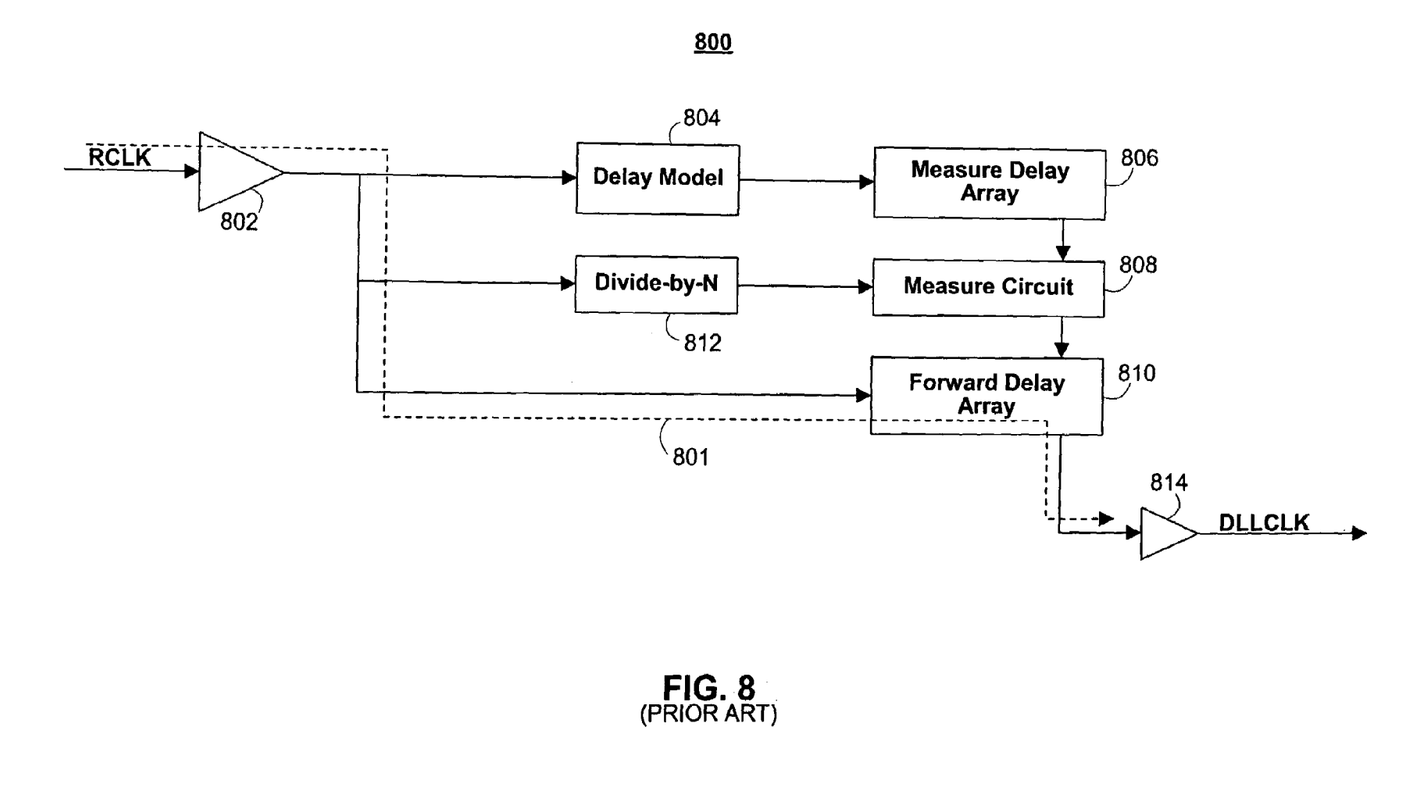
FIG. 8 is a block diagram of a typical Measure-Controlled Delay (MCD)
Figure 9:
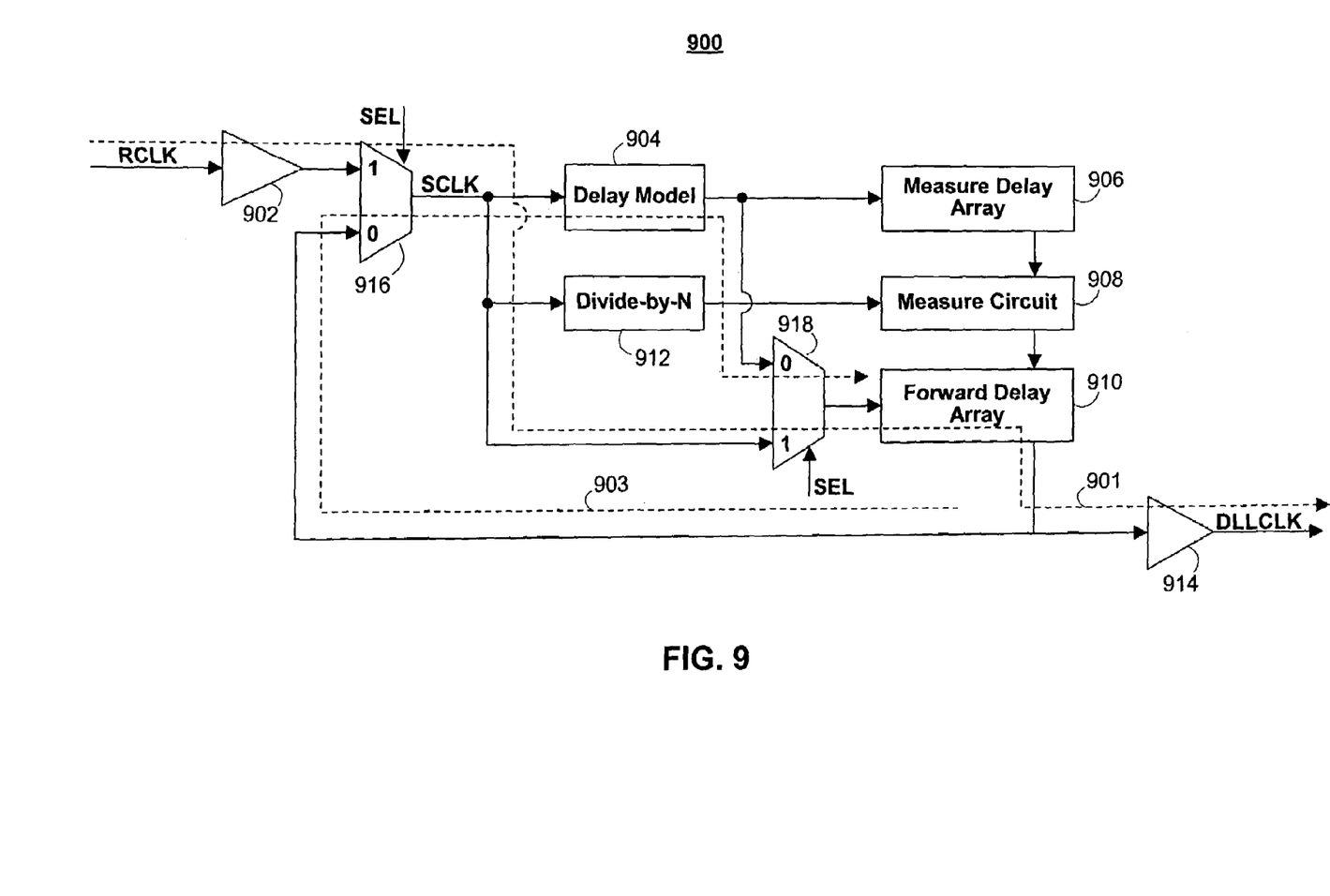
FIG. 9 is a block diagram of a clock capturing MCD according to the invention.

Although the previous embodiments all relate to a DLL, the invention may be used with other types of clock synchronization circuitry. For example, FIG. 6 shows a typical Synchronous Mirror Delay (SMD) and FIG. 7 shows a clock capturing SMD according to the invention. Also, FIG. 8 shows a typical Measure-Controlled Delay (MCD) and FIG. 9 shows a clock capturing MCD according to the invention. For example, FIG. 7B shows an illustrative block diagram of a clock capturing SMD including pulse generator 720 which can operate in a similar manner as pulse generator 516 (FIG. 5). As with pulse generator 516, pulse generator 720 can also be replaced by a duty cycle correction circuit.

FIG. 6 illustrates typical SMD 600, which includes input buffer 602, delay model 604, forward delay array 606, mirror control circuit 608, backward delay array 610, divide-by-n counter 612, and output buffer 614.

Forward delay array 606 and backward delay array 610 are made up of a series of delay elements. Ideally, the delay characteristics of forward delay array 606 and backward delay array 610 are identical. Forward delay array 606 has a series of parallel outputs corresponding respectively to each delay element, and backward delay array 610 has a series of parallel inputs corresponding respectively to each of its delay elements. After a clock signal is input to forward delay array 606, it begins to propagate through the delay elements. When the clock signal reaches the Kth delay element, mirror control circuit 608, driven by divide-by-n counter 612, causes the clock signal to be output from the Kth delay element of forward delay array 606 and input to the Kth delay element of backward delay array 610. After the clock signal is input to backward delay array 610, it propagates through the same number of delay elements as it did in forward delay array 606 before exiting backward delay array 610. Ideally, the clock signal delay introduced by forward delay array 606 is equal to the delay introduced by backward delay array 610 and the total array delay is equal to $2*(t_{ck}-(D1+D2))$.

In forward signal path 601 of SMD 600, reference clock signal RCLK is input through input buffer 602 and delay model 604 and enters forward delay array 606. Input and output buffers 602 and 614 and delay model 604 have similar delay characteristics as in the previously described DLL circuitry. After divide-by-N counter 606 counts N clock cycles, it triggers mirror control circuit 608. The number N is based on the length of the delay array and speed of the clock signal. N may be fixed by the design of the clock synchronization circuitry or may be variable. Mirror control circuit 608 causes the clock signal in forward delay array 606 to be transferred to backward delay array 610. After N more clock cycles, the synchronized output clock signal is output through output buffer 614. The total delay of the forward path is equal to $2*N*t_{ck}$.

FIG. 7 illustrates clock capturing SMD 700 in accordance with the invention. SMD 700 includes input buffer 702, delay model 704, forward delay array 706, mirror control circuit 708, backward delay array 710, divide-by-N counter 712, and output buffer 714, which all operate similarly or identically to their corresponding counterparts in SMD 600. SMD 700 also includes feedback path 703 which preferably includes multiplexer 716 and delay model 718.

Input reference clock signal RCLK is delayed and synchronously output as DLLCLK. However, additional feedback path 703 allows the synchronized clock signal to be captured and oscillated. When multiplexer 716 is switched to output the fed back signal, a closed loop oscillator is formed. Delay model 718 is preferably identical to delay model 704 and provides a total feedback signal path delay that equals the total delay of forward signal path 701 (i.e., $2*N*t_{ck}$).

FIG. 8 illustrates typical MCD 800, which includes input buffer 802, delay model 804, measure delay array 806, measure circuit 808, forward delay array 810, divide-by-n counter 812, and output buffer 814.

Measure delay array 806 and forward delay array 810 each include a series of delay elements. Ideally, measure delay array 806 and forward delay array 810 provide identical amounts of delay. The reference clock signal is input to measure delay array 806 and forward delay array 810. The reference clock signal propagates through the delay elements of both delay arrays. Measure circuit 808 is enabled before the clock signal reaches the final delay element in measure delay array 806. Measure circuit 808 measures the progress of the clock signal through the delay elements of measure delay array 806, and sets forward delay array 810 to output its clock signal after that same number of delay elements. Thus, for example, if the clock signal had propagated through the Kth delay element of measure delay array 806, forward delay array 810 will be set to output the clock signal after K delay elements.

In forward signal path 801 of MCD 800, reference clock signal RCLK is input though input buffer 802 and delay model 804 and enters measure delay array 806. RCLK is simultaneously input through input buffer 802 to forward delay array 810. The clock signal is propagated through delay model 804 and measure delay array 806 to measure the proper delay to set for the forward delay array 810. Only the clock signal input to forward delay array 810 will be output as DLL output signal DLLCLK. The input and output buffers 802 and 814 and delay model 804 have delay characteristics similar to the previously described DLL and SMD circuits. After divide-by-N counter 812 counts N clock cycles, it triggers measure circuit 808. Measure circuit 808 measures the number of unit delays that the clock signal has propagated in measure delay array 806 and sets forward delay array 810 to use the same number of unit delay elements. The clock signal is then output from forward delay array 810 at the delay element set by measure circuit 808. (Note that reference clock signal RCLK propagates through delay model 804 before being input to measure delay array 806, and the RCLK is input to forward delay array 810 without this additional delay. Thus, the clock signal propagates through forward delay array 810 more quickly than through measure delay array 806. Therefore, some clock pulses may be lost (or have incorrect phase) before the proper delay element of forward delay array 810 is selected by measure delay array 806. This delay (or time with incorrect phase) is part of the initialization of the SMD.) The total delay of the forward signal path is equal to $N*t_{ck}$.

FIG. 9 illustrates clock capturing MCD 900 in accordance with the invention. MCD 900 includes input buffer 902, delay model 904, measure delay array 906, measure circuit 908, forward delay array 910, divide-by-n counter 912, and output buffer 914, which all operate similarly or identically to their corresponding counterparts in MCD 800. MCD 900 also includes feedback path 903 which preferably includes multiplexers 916 and 918.

In MCD 900, input reference clock signal RCLK is delayed and synchronously output as DLLCLK. Feedback path 903 allows the synchronized clock signal to be captured and oscillated through MCD 900. Multiplexers 916 and 918 allow the feedback signal to be fed to delay model 904 and forward delay array 910. The total delay of feedback signal path 903 is equal to forward signal path 901 (i.e., $N*t_{ck}$).

Figure 10:
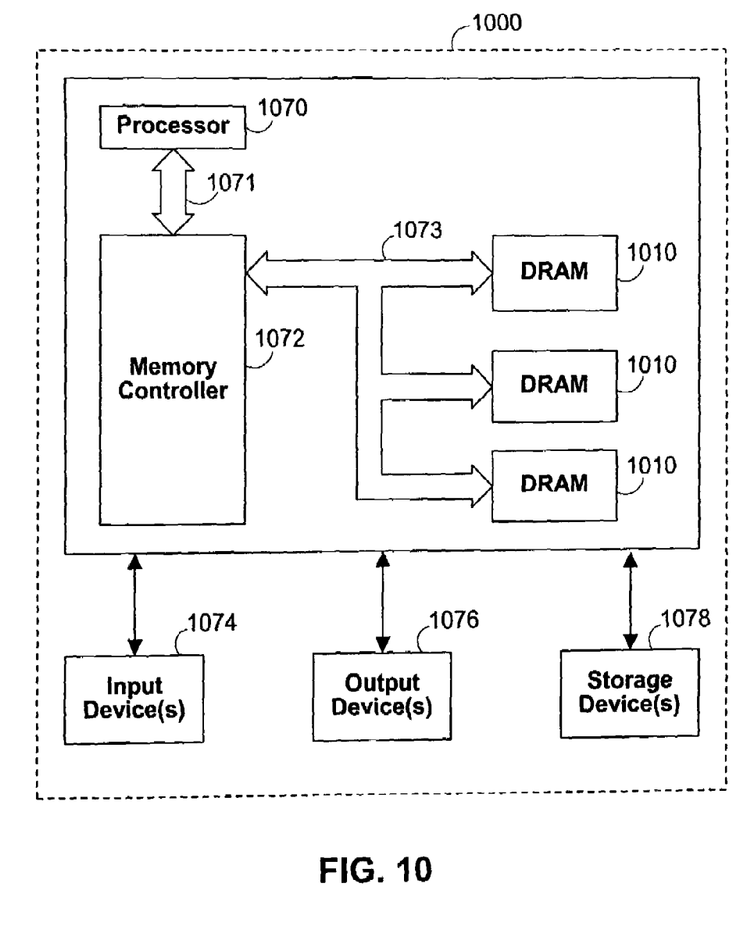
FIG. 10 is a block diagram of a system that incorporates the invention.

FIG. 10 shows a system that incorporates the invention. System 1000 includes a plurality of DRAM chips 1010, a processor 1070, a memory controller 1072, input devices 1074, output devices 1076, and optional storage devices 1078. Data and control signals are transferred between processor 1070 and memory controller 1072 via bus 1071. Similarly, data and control signals are transferred between memory controller 1072 and DRAM chips 1010 via bus 1073. One or more DRAM chips 1010 include clock capturing synchronization circuitry in accordance with the invention. The clock capturing circuitry may also be included in memory controller 1072. Moreover, clock capturing synchronization circuitry in accordance with the invention may be included in any part of the system that requires clock synchronization. Such synchronization circuitry can be used to perform read operations when entering power down states and/or to reduce input referred jitter. Input devices 1074 can include, for example, a keyboard, a mouse, a touch-pad display screen, or any other appropriate device that allows a user to enter information into system 1000. Output devices 1076 can include, for example, a video display unit, a printer, or any other appropriate device capable of providing output data to a user. Note that input devices 1074 and output devices 1076 can alternatively be a single input/output device. Storage devices 1078 can include, for example, one or more disk or tape drives.

Note that the invention is not limited to DRAM chips or systems that include DRAM chips, but is applicable to other systems and integrated circuits that can benefit from such clock (or other periodic signal) capturing synchronization.

Thus it is seen that clock capturing synchronization circuitry is provided. One skilled in the art will appreciate that the invention can be practiced by other than the described embodiments, which are presented for purposes of illustration and not of limitation, and the present invention is limited only by the claims which follow.

We claim:

1. A clock synchronization circuit comprising:
 a synchronous mirror delay circuit operative to receive a periodic reference signal and to provide an output signal synchronized to said periodic reference signal; and
 clock capture circuitry operative to feed back said synchronized output signal to an input of said synchronous mirror delay circuit and maintain said synchronized output signal independent of said periodic reference signal.

2. The clock synchronization circuit of claim 1 wherein said clock capture circuitry is operative to maintain said synchronized output signal when said periodic reference signal is unavailable.

3. The clock synchronization circuit of claim 1 wherein said clock capture circuitry is operative to maintain said synchronized output signal when said periodic reference signal is available.

4. The clock synchronization circuit of claim 1 wherein said clock capture circuitry further comprises a multiplexer operative to switch said input of said synchronous mirror delay circuit between said periodic reference signal and said fed back synchronized output signal.

5. The clock synchronization circuit of claim 1 wherein said clock capture circuitry further comprises a phase mixer operative to mix said periodic reference signal and said fed back synchronized output signal and to provide said mixed signal to said input of said synchronous mirror delay circuit.

6. The clock synchronization circuit of claim 1 wherein said clock capture circuitry further comprises a delay circuit operative to delay said fed back synchronized output signal.

7. The clock synchronization circuit of claim 1 wherein said clock capture circuitry further comprises regenerating circuitry operative to regenerate said fed back synchronized output signal.

8. The clock synchronization circuit of claim 1 wherein said regenerating circuitry comprises a pulse generator operative to generate a pulse with a predetermined width synchronized to said periodic reference signal.

9. The clock synchronization circuit of claim 1 wherein said regenerating circuitry comprises a duty cycle correction circuit operative to maintain the duty cycle of said fed back synchronized output signal.

10. The clock synchronization circuit of claim 1 wherein said synchronized output signal is synchronized to the periodic reference signal by phase.

11. The clock synchronization circuit of claim 1 wherein said synchronous mirror delay circuit comprises:
- a first delay array;
- a second delay array; and
- a mirror control circuit operative to transfer a delayed periodic reference signal from said first delay array to said second delay array.

12. The clock synchronization circuit of claim 11 wherein said first delay array and said second delay array are operative to provide substantially equal amounts of delay.

13. The clock synchronization circuit of claim 11 further comprising a counter circuit operative to count clock cycles of said periodic reference signal and wherein said mirror control circuit is operative to transfer said delayed periodic reference signal in response to a predetermined number of clock cycles.

14. The clock synchronization circuit of claim 12 wherein synchronizing said synchronizing output signal comprises adjusting said predetermined number.

15. A clock synchronization circuit comprising:
- a multiplexer having a first input operative to receive a periodic reference signal, a second input, an output, and a control input operative to select one of said first and second inputs to couple to said output;
- a first delay circuit having an input coupled to said multiplexer output and an output, said delay circuit operative to delay a signal propagating from said first delay circuit input to said first delay circuit output;
- a first array having an input coupled to said first delay circuit output and a series of delayed periodic signal outputs, each of said outputs providing an output signal with a progressively increasing amount of delay;
- a second array having an output and a series inputs, each of said inputs having a progressively increasing amount of delay between it and said second array output;
- a counter having an input coupled to receive said periodic reference signal and an output, said counter operative to output a signal after a set number of clock cycles of said periodic reference signal have been counted;
- a mirror control circuit having a control input coupled to said counter output, said mirror control circuit operative to transfer said delayed periodic signal from one of said first array outputs to an input of said second array; and
- a second delay circuit having an input coupled to said second array output and an output coupled to said multiplexer second input, said delay circuit operative to delay a signal propagating from said second delay circuit input to said second delay circuit output.

16. The clock synchronization circuit of claim 15 further comprising a pulse generator having an input and an output, said pulse generator connected to the output of said second array, wherein said pulse generator is operative to output a pulse of a predetermined width, synchronized with the output of said second array.

17. The clock synchronization circuit of claim 15 further comprising a duty cycle correction circuit having an input and an output, said duty cycle correction circuit input connected to the output of said second array, wherein said duty cycle correction circuit is operative to maintain the duty cycle of said delayed periodic reference signal.

18. A computer system comprising:
- a processor;
- a memory controller coupled to said processor; and
- a plurality of dynamic random access memory (DRAM) chips coupled to said memory controller, at least one of said DRAM chips comprising a clock synchronization circuit comprising:
  - a multiplexer having a first input operative to receive a periodic reference signal, a second input, an output, and a control input operative to select one of said first and second inputs to couple to said output;
  - a first delay circuit having an input coupled to said multiplexer output and an output, said delay circuit operative to delay a signal propagating from said first delay circuit input to said first delay circuit output;
  - a first array having an input coupled to said first delay circuit output and a series of delayed periodic signal outputs, each of said outputs providing an output signal with a progressively increasing amount of delay;
  - a second array having an output and a series inputs, each of said inputs having a progressively increasing amount of delay between it and said second array output;
  - a counter having an input coupled to receive said periodic reference signal and an output, said counter operative to output a signal after a set number of clock cycles of said periodic reference signal have been counted;
  - a mirror control circuit having a control input coupled to said counter output, said mirror control circuit operative to transfer said delayed periodic signal from one of said first array outputs to an input of said second array; and
  - a second delay circuit having an input coupled to said second array output and an output coupled to said multiplexer second input, said delay circuit operative to delay a signal propagating from said second delay circuit input to said second delay circuit output.

19. The computer system of claim 18 further comprising a pulse generator having an input and an output, said pulse generator connected to the output of said second array, wherein said pulse generator is operative to output a pulse of a predetermined width, synchronized with the output of said second array.

20. The computer system of claim 18 further comprising a duty cycle correction circuit having an input and an output, said duty cycle correction circuit input connected to the output of said second array, wherein said duty cycle correction circuit is operative to maintain the duty cycle of said delayed periodic reference signal.

* * * * *

UNITED STATES PATENT AND TRADEMARK OFFICE
CERTIFICATE OF CORRECTION

PATENT NO.        : 7,423,462 B2
APPLICATION NO.   : 11/489367
DATED             : September 9, 2008
INVENTOR(S)       : Adrian J. Drexler et al.

It is certified that error appears in the above-identified patent and that said Letters Patent is hereby corrected as shown below:

Column 7, line 10, change "though" to --through--

Column 9, line 33, change "series inputs" to --series of inputs--

Column 10, line 24, change "series inputs" to --series of inputs--

Signed and Sealed this

Twentieth Day of January, 2009

JON W. DUDAS
*Director of the United States Patent and Trademark Office*